(12) United States Patent
Freels et al.

(10) Patent No.: US 8,014,544 B2
(45) Date of Patent: Sep. 6, 2011

(54) COMPUTER INSTALLED STEREO PA AMPLIFIER CARD

(76) Inventors: Stephen Freels, Rochelle, IL (US); Rick Calderon, DeKalb, IL (US)

( * ) Notice: Subject to any disclaimer, the term of this patent is extended or adjusted under 35 U.S.C. 154(b) by 1036 days.

(21) Appl. No.: 11/899,123

(22) Filed: Sep. 4, 2007

(65) Prior Publication Data

US 2009/0060221 A1    Mar. 5, 2009

(51) Int. Cl.
*H04R 27/00* (2006.01)
*H03F 99/00* (2009.01)

(52) U.S. Cl. ............... 381/120; 381/122; 381/82

(58) Field of Classification Search ............ 381/120
See application file for complete search history.

(56) References Cited

U.S. PATENT DOCUMENTS

| | | | |
|---|---|---|---|
| 6,198,825 B1 * | 3/2001 | Daryanani | 381/3 |
| 6,895,563 B2 * | 5/2005 | Dixon et al. | 716/136 |
| 7,755,506 B1 * | 7/2010 | Clegg et al. | 340/12.3 |
| 2006/0096445 A1 * | 5/2006 | Leach | 84/453 |

* cited by examiner

*Primary Examiner* — Kiesha Bryant
*Assistant Examiner* — Igwe U Anya

(57) ABSTRACT

The present invention is a stereo PA amplifier that is mounted inside a desktop computer. It is powered by the computer's 12-volt power supply and receives its input via a stereo mini cable from the computer's audio line out. Standard 8-ohm, non-powered speakers are then hooked up directly to the board via its speaker connector board. The volume of the present invention is adjusted by the computer's volume controls. The device eliminates the need for an external stereo amp and external mixer, which thereby reduces the installation time, cost, interconnecting cables, and the space needed for the overall computer system, while at the same time providing quality sound.

10 Claims, 9 Drawing Sheets

| Name | PART | PACKAGE | SMT | MFG | PART # |
|---|---|---|---|---|---|
| C1 | 0.1UF 50V | 1/10W 0805 | X | | 08055C104KAT2A |
| C5 | 0.1UF 50V | 1/10W 0805 | X | | 08055C104KAT2A |
| C10 | 0.1UF 50V | 1/10W 0805 | X | | 08055C104KAT2A |
| C16 | 220UF 10V | 8X8MM | X | NICHICON | UWX1A221MCL1GB |
| C17 | 220UF 10V | 8X8MM | X | NICHICON | UWX1A221MCL1GB |
| C18 | 220UF 10V | 8X8MM | X | NICHICON | UWX1A221MCL1GB |
| C19 | 220UF 10V | 8X8MM | X | NICHICON | UWX1A221MCL1GB |
| C20 | 220UF 10V | 8X8MM | X | NICHICON | UWX1A221MCL1GB |
| C21 | 220UF 10V | 8X8MM | X | NICHICON | UWX1A221MCL1GB |
| C22 | 220UF 10V | 8X8MM | X | NICHICON | UWX1A221MCL1GB |
| C23 | 220UF 10V | 8X8MM | X | NICHICON | UWX1A221MCL1GB |
| C24 | 220UF 10V | 8X8MM | X | NICHICON | UWX1A221MCL1GB |
| C25 | 220UF 10V | 8X8MM | X | NICHICON | UWX1A221MCL1GB |
| C32 | 33PF 50V | 1/10W 0805 | X | | ECJ-2VC1H330J |
| C34 | 33PF 50V | 1/10W 0805 | X | | ECJ-2VC1H330J |
| C35 | 1UF 50V | MVE | X | UCHEMI | EMVE500ADA1R0MD5 |
| C36 | 10UF 35V | MVA | X | UCHEMI | EMVA350ADA100MD5 |
| C37 | 10UF 35V | MVA | X | UCHEMI | EMVA350ADA100MD5 |
| C39 | 100UF 6.3V | 6X6MM | X | UCHEMI | EMVA6R3ADA101ME5 |
| C40 | 1UF 50V | MVE | X | UCHEMI | EMVE500ADA1R0MD5 |
| C42 | 100UF 6.3 | 6X6MM | X | UCHEMI | EMVA6R3ADA101ME5 |
| D1 | BICOLOR R/G | 1210 SMT LED | X | LITE-ON | LTST-C155KGJRKT |
| R16 | 470K | 1/10W 0805 | X | | RC0805JR-07470KL |
| R17 | 10 OHM | 1/10W 0805 | X | | ERA-S39J100V |
| R18 | 10 OHM | 1/10W 0805 | X | | ERA-S39J100V |
| R19 | 10 OHM | 1/10W 0805 | X | | ERA-S39J100V |
| R20 | 10 OHM | 1/10W 0805 | X | | ERA-S39J100V |
| R21 | 10 OHM | 1/10W 0805 | X | | ERA-S39J100V |
| R22 | 10 OHM | 1/10W 0805 | X | | ERA-S39J100V |
| R23 | 300K | 1/10W 0805 | X | | RC0805JR-07300KL |
| R24 | 300K | 1/10W 0805 | X | | RC0805JR-07300KL |
| R25 | 470K | 1/10W 0805 | X | | RC0805JR-07470KL |
| R26 | 1.2K | 1/10W 0805 | X | | ERJ-6GEYJ122V |
| R27 | 1.2K | 1/10W 0805 | X | | ERJ-6GEYJ122V |
| R28 | 4.7K | 1/10W 0805 | X | | RC0805JR-07470KL |
| U3A | LM386M-1 | SOIC8 | X | NAT SEMI | LM386-1 |
| U4A | LM386M-1 | SOIC8 | X | NAT SEMI | LM386-1 |
| BRAC | PCI 9 POS | KEYSTONE | X | KEYSTONE | 9200-2 |
| PCB | OBAII REVE | TBD | X | TBD | OBA IIREVE |
| PCB | SPKR CONN | TBD | X | TBD | SPKR CONN |
| J1 | 4 PIN @ 0.10" | DC INPUT | X | 3M | 929500-01-36 |
| J2 | DB9 F .318" | OUTPUT | X | NORCOMP | 182-009-213R531 |
| J3 | 3.5 MM JACK | STEREO INPUT | X | CUI INC | SJ-3513N |

FIG. 1

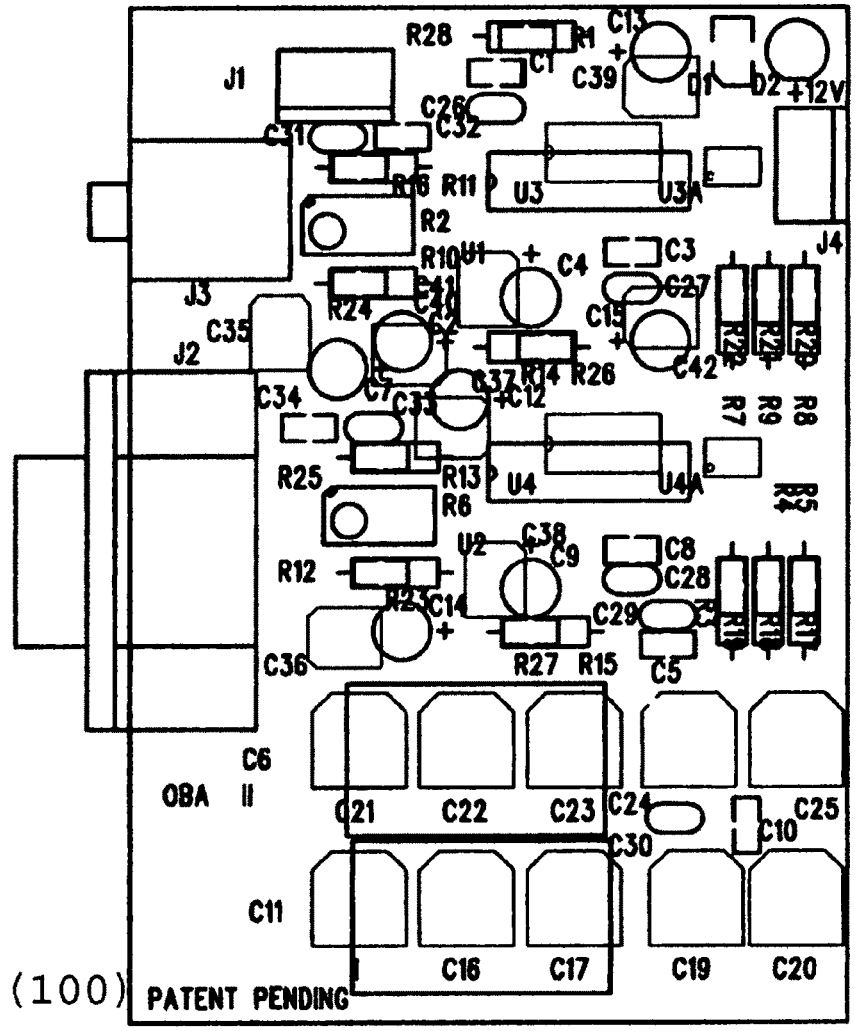
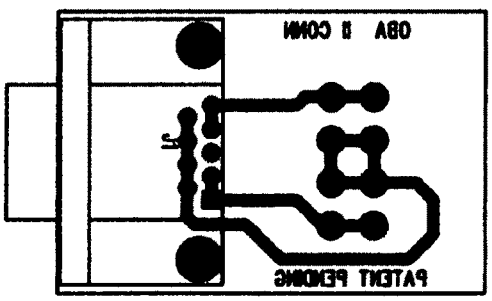
FIG. 3

COMPUTER INSTALLED STEREO PA AMPLIFIER CARD

BACKGROUND OF THE INVENTION

1. Field of the Invention

This invention relates generally to a computer installed stereo PA amplifier card.

2. Background

The state of the computer presentation industry is developing to include a comprehensive audio distribution or PA system. Currently there are a number of solutions for computer audio amplification but some of these solutions fail to meet the needs of the industry because of amplifier limitations. Some of the solutions attempt to address amplification but they fall short because of speaker placement limitations, use of powered speakers, expensive amplifying equipment, or complex installation. Other solutions that attempt to integrate an audio amplifier are similarly lacking because of needing either heat sinks or cooling fans to dissipate the heat.

It would, therefore, be desirable to have a device that: (1) is a less expensive, more efficient solution to computer audio in a presentation situation regardless of venue, whether the venue is a classroom, conference room, home or office; (2) would make it possible to replace an external amp and mixer, which would thereby reduce the cost and space requirements, as well as reduce cabling, and installation time; (3) reduces system failures and operator errors, which would thereby reduce service calls; (4) does not limit speaker placement to the immediate vicinity of the computer; and (5) allows for efficient operation while still eliminating the need for heat sinking and fans, yet delivers ample volume levels.

SUMMARY OF THE INVENTION

The present invention advantageously fills the aforementioned deficiencies by providing a computer installed stereo PA amplifier card that provides a less expensive, more efficient solution to computer audio in a presentation situation regardless of venue. The present invention also makes it possible to replace an external amp and mixer, which thereby reduces the cost and space requirements, as well as reduces cabling, and installation time. Furthermore, the present invention: (1) reduces system failures and operator errors, which thereby reduces service calls; (2) does not limit speaker placement to the immediate vicinity of the computer; and (3) allows for efficient operation while still eliminating the need for heat sinking and fans, yet delivers ample volume levels.

The invention is preferably made up of the following components: a circuit board that contains the actual amplifying circuitry and a separate speaker connector board to which the speakers are attached. Although there is some room for variation in size, space constrictions should be considered in order to appropriately accommodate the invention within the available space of the computer. The optimal size of the invention will allow it to fit into any desktop computer without imposing on the other boards, wiring or case (enclosure) of the computer. Because the invention does not plug into the PCI card slot the board needs to stay above it. The possibility exists, however, to use the PCI edge connector on the mother board as physical support for the amplifier board. By adding circuitry and traces to a PCI edge of the amplifier board, a digital interconnect would be established for transfer of data from the main (mother) board to the amplifier board. The operating parameters of the amplifier board would then be controlled by software applications on the computer and then the amplified audio would be output to the speakers. Nevertheless, the speaker connector board resides outside of the computer's case, and as such is more flexible in terms of size.

The amp board is attached to a mounting bracket so it may be mounted in an empty card slot of a desktop computer. This mounting bracket has a female stereo mini connector for the line input (to receive the audio signal from the computer's audio line output) and a female DB9 connector that is connected (externally) to the speaker connector board. This speaker connector board contains a male DB9 connector and 4 position screw terminal strip. Two standard 8-ohm speakers are attached to this "speaker connector board" through the 4 position screw terminal strip and then this board is attached to the amp board at the DB9 connection. A ferrite bead is attached to the speaker lines at the connector board to prevent RF interference. It receives power and the audio signal from the computer. The low current draw reduces heat dissipation negating any heat sink or cooling fan requirements yet provides ample sound levels.

The invention is made up of a circuit board containing the amplifying circuitry and a second smaller circuit board to connect speaker wires to the amplifying board. The circuit board has three circuit layouts to accommodate thru hole parts as well as surface mount parts, two being thru hole and one being surface mount. Various components that are well known in the industry and which perform the same function are capable of achieving P.A. amplification. The amplifying circuit board size and shape is limited and determined by the available space in the computer. Audio line level input is through a stereo mini cable from the computers line out. The amplifier board may incorporate a header for internally connecting the audio line level input and also have a volume control that would be accessible at the computer bracket. Line level inputs adjustments would be made by adding potentiometers and making them available for adjustment at the computer bracket or internally on the board. The use of tabs on the computer bracket, to attach to the circuit board, would allow the use of a variety of different connectors at the bracket for input and output connections, such as RCA, spring loaded push connectors and the like.

A DB9 male pigtail cable may be used as a way to connect the amplifier board to the speakers by soldering the wire connections as a means of wire termination. Another method would be to solder the speaker wires directly to the amplifier board. External use of the amplifier board is achieved by using an enclosure and adding an external ac to dc transformer or using a computer bracket with an adapter for connection to the computer's power supply cable and then the external enclosure equipped with a cable to reach the computer and match the connection at the bracket. Audio line level output from the computer would be either a stereo mini cable or a USB cable. Additional circuitry added to either the internal or external design amplifier board would provide means of having signal audio processing for surround sound 5.1 or 7.1, adding a subwoofer, equalizer, tone, reverb, echo etc., sound effects (hall, stadium, under water etc.). Additional circuitry would also provide being able to connect an Mp3 player, USB drive directly or other equipment capable of audio line out. By incorporating the amplifier board circuitry of the device directly onto the mother (main) board of the computer, sound card or any other card in the computer there would be only a need for connectors in the back panel of the computer or at a computer bracket fitted with the appropriate connectors. By resizing and then utilizing the different electrical connections as mentioned above installation of the circuit board into a 3.5 or 5.25 inch bay is also an alternative for mechanical placement. Additionally the device with an electrical connection to the PCI card slot on the main (mother)

board of the computer would allow for user control by means of software over the various operating aspects of the added circuitry.

It is an object of the present invention to provide a computer based presentation system, audio and it's amplification that offers increased efficiencies over known devices. Specifically, it is an object of the present invention to provide a solution that is more cost effective, while further providing decreased installation time, decreased space requirements, less external wiring and fewer components.

It is still another object of the present invention to provide a computer integrated amplifier that allows the placing of speakers in optimum room positions.

It is further still an object of the present invention to allow for additional speakers to be added by duplicating the circuit on the amp board or by adding additional amp boards.

Finally, it is an object of the present invention to provide a computer installed stereo PA amplifier card that does not suffer from any of the problems or deficiencies associated with the prior art.

The present invention now will be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments set forth herein; rather, these embodiments are provided by way of illustration only and so that this disclosure will be thorough, complete and will fully convey the full scope of the invention to those skilled in the art.

BRIEF DESCRIPTION OF THE DRAWINGS

FIG. 1 shows the parts list for the device.
FIG. 3 shows the blank printed circuit boards.

DETAILED DESCRIPTION OF THE INVENTION

The present invention is directed to a computer installed stereo PA amplifier card.

With respect to FIG. 1, what is shown is the parts list for the device. The parts list (10) contains information about the parts, including the following: name/designation number, their value, package type and manufacturer part number. This information is used for the ordering of the components and parts. The designation number also gives the location where the components and parts go on the printed circuit boards.

Of course, those skilled in the art will appreciate that various other components could be used to produce the present invention. This parts list is, therefore, provided as an example and illustrative of the preferences of the inventors. By using other components, such as, thru hole components, the present invention could also be produced. Alternatively to the printed circuit boards, other types of boards may be used, such as, perforated boards or prototyping boards. Connections to the board, such as input, output, and/or power could be hardwired to the board. By knowing the components and their values, certain substitutions might therefore be made as long as the parameters that make this device unique are maintained.

Figure 2:
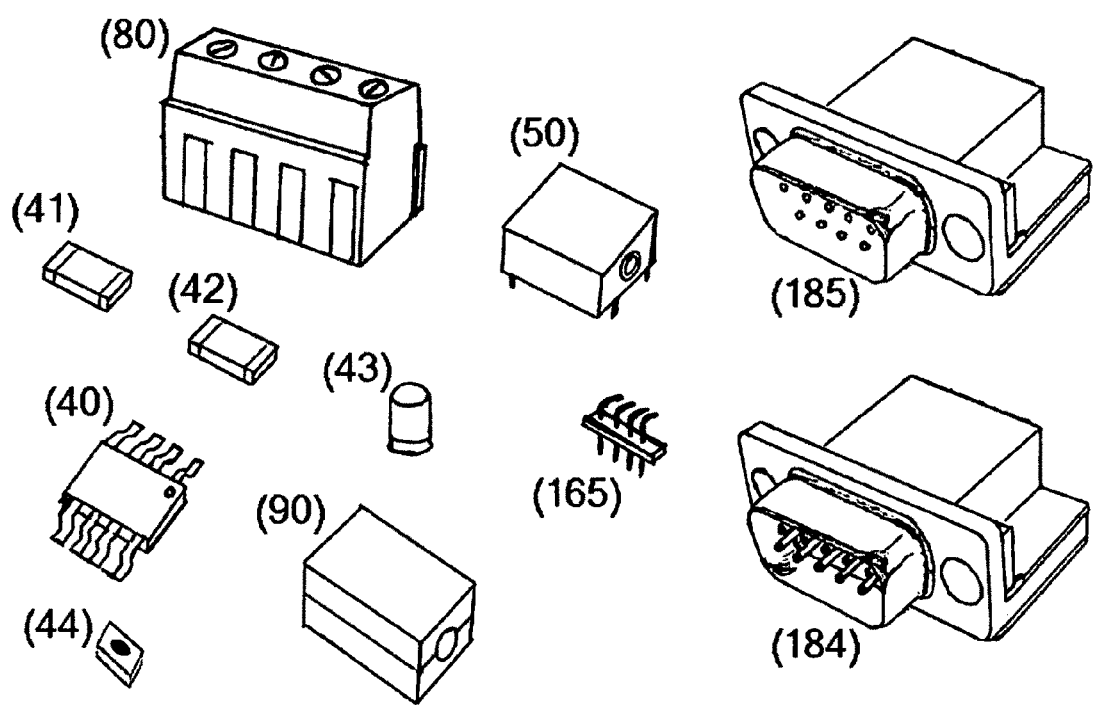
FIG. 2 shows various components and parts.

With respect to FIG. 2, what is shown are the various components. Components such as the I.C. chip (40), chip resistor (41), chip capacitor (42), electrolytic capacitor (43), chip LED (44), and parts, the ferrite bead (90), the four pin header (165), the stereo mini jack (50), male DB9 (184), female DB9 (185) and the four position screw terminal strip (80) are all parts for the assembly of the P.A. amplifier and speaker connector boards.

With respect to FIG. 3, what is shown are the blank printed circuit boards. The blank P.A. amplifier board (100) and the speaker connector board (110) have been drilled, etched, plated and silk screened. They each have components and part designators and are ready to be assembled.

Figure 4:
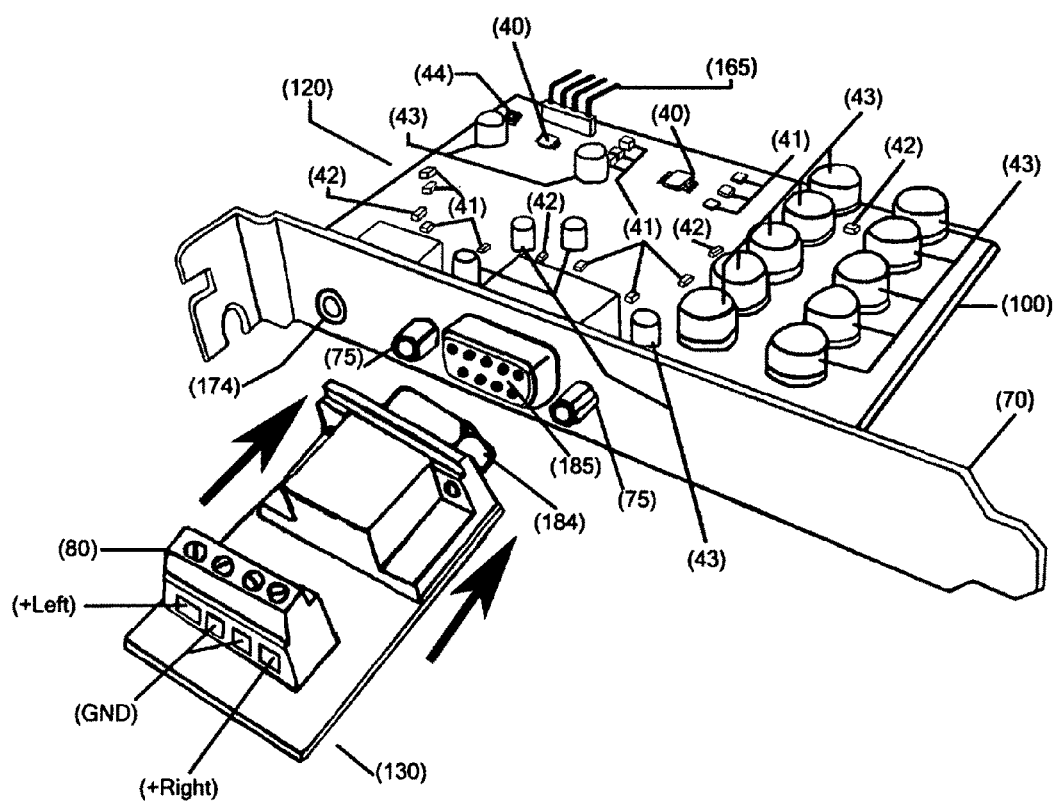
FIG. 4 shows one particular version of the present invention assembled.

With respect to FIG. 4, what is shown is an assembled version of the present invention. With the components, I.C. chip (40), chip resistor (41), chip capacitor (42), electrolytic capacitor (43), chip LED (44), and the four pin header (165) disposed on an amplifier board (100). Also shown are the male DB9 (184), female DB9 (185) and the four position screw terminal strip (80), which are preferably soldered in place onto the speaker connection board (130). Stand off screws (75) are preferable to attach the device (120) to the computer bracket (70), as is at least one stereo mini jack (174). The stand off screws (75) may, however, be replaced by any fastener or clip that locks the device (120) to the bracket (70). The computer bracket (70) allows for the securing the device at the computers card slot opening. The header (165) is used for the power supply connection. The stereo mini jack (174) is used for the audio line input. The female DB9 (185) outputs the amplified audio and is where the speaker connector board (130) is attached. The arrows indicate the speaker connector board's attachment to the present invention (120). The male DB9 (184) on the speaker connector board (130) plugs into the female DB9 connector (185) of the present invention (120). The speaker wires are connected to the four position terminal screw strip (80) observing the polarity: +Left, Gnd, Gnd, +Right. The speaker connector board (130) allows for the connection of speakers to the present invention (120). Of course those skilled in the art will appreciate that various other connectors could be used to produce the present invention. Those connectors therefore, are provided as an example and illustrative of the preference of the present inventors.

Figure 5:
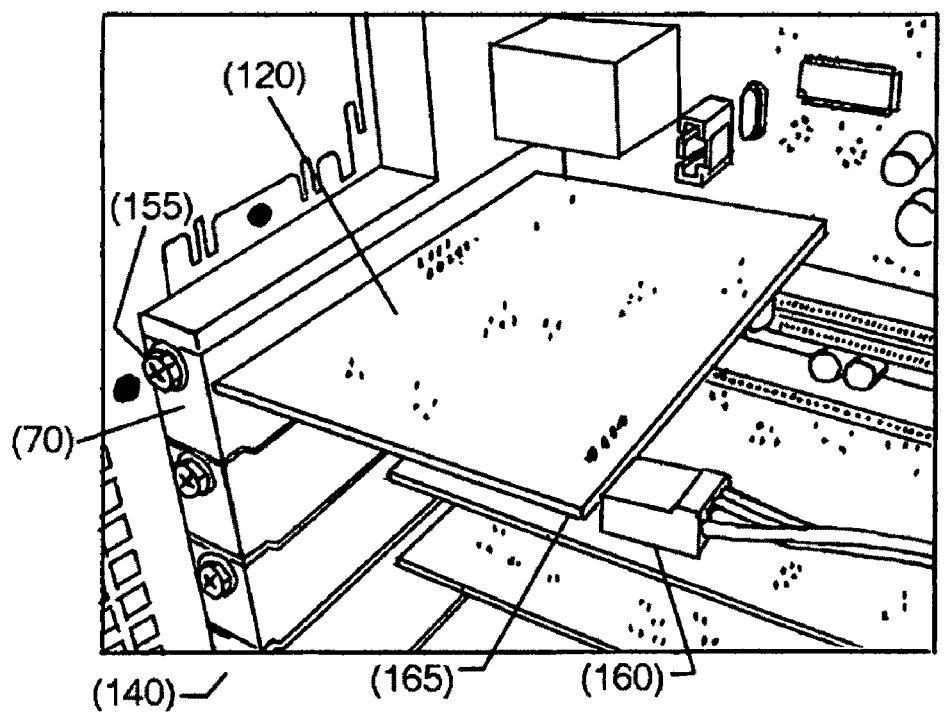
FIG. 5 shows one particular version of the present invention installed in a computer.

With respect to FIG. 5, what is shown is the assembled invention (120) installed inside a computer (140). The screw (155), of the computer's case, secures the assembled invention (120) in an open card slot of the computer by means of the computer bracket (70). The computer's power supply cable (160) is connected to the four pin header (165) on the present invention (120).

Figure 6:
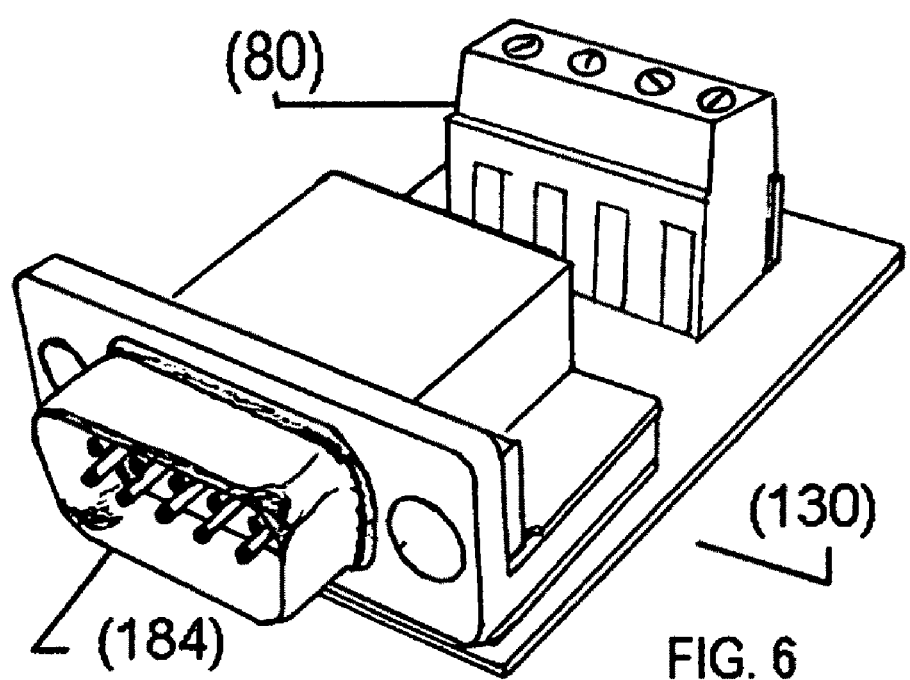
FIG. 6 shows the speaker connector board assembled.

With respect to FIG. 6, what is shown is the speaker connector board assembled. With the DB9 (184) and the four position screw terminal strip (80) soldered in place. The speaker connector board (130) is ready to be attached to the present invention. The speaker wires are also connected to the speaker connector board (130) at the four position screw terminal strip (80).

Figure 7:
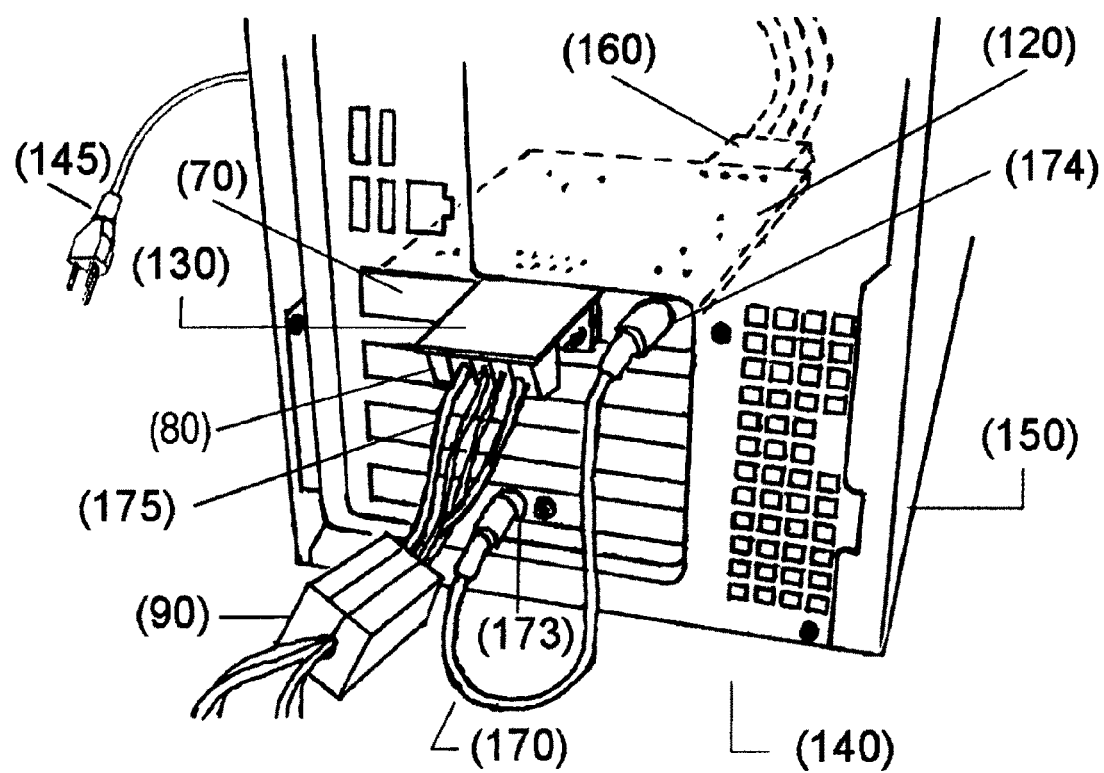
FIG. 7 shows the back of a computer with the present invention completely installed.

With respect to FIG. 7, what is shown is the back of the computer with the present invention completely installed. The computer (140) is shown with its side panel (150) intact and ac power cord (145). It has the speaker connector board (130) attached at the computer bracket (70) of the present invention (120), the hidden view of which is shown by dashed lines on the inside of the computer (140). The speaker wires (175) are connected at the four position screw terminal strip (80). The ferrite bead (90) is placed around all four speaker wires (175) next to the speaker connector board (130). The stereo mini cable (170) is then used to connect the computer's line output (173) to the line input of the present invention at the stereo mini jack (174). The power supply connector (160) provides power.

Figure 8:
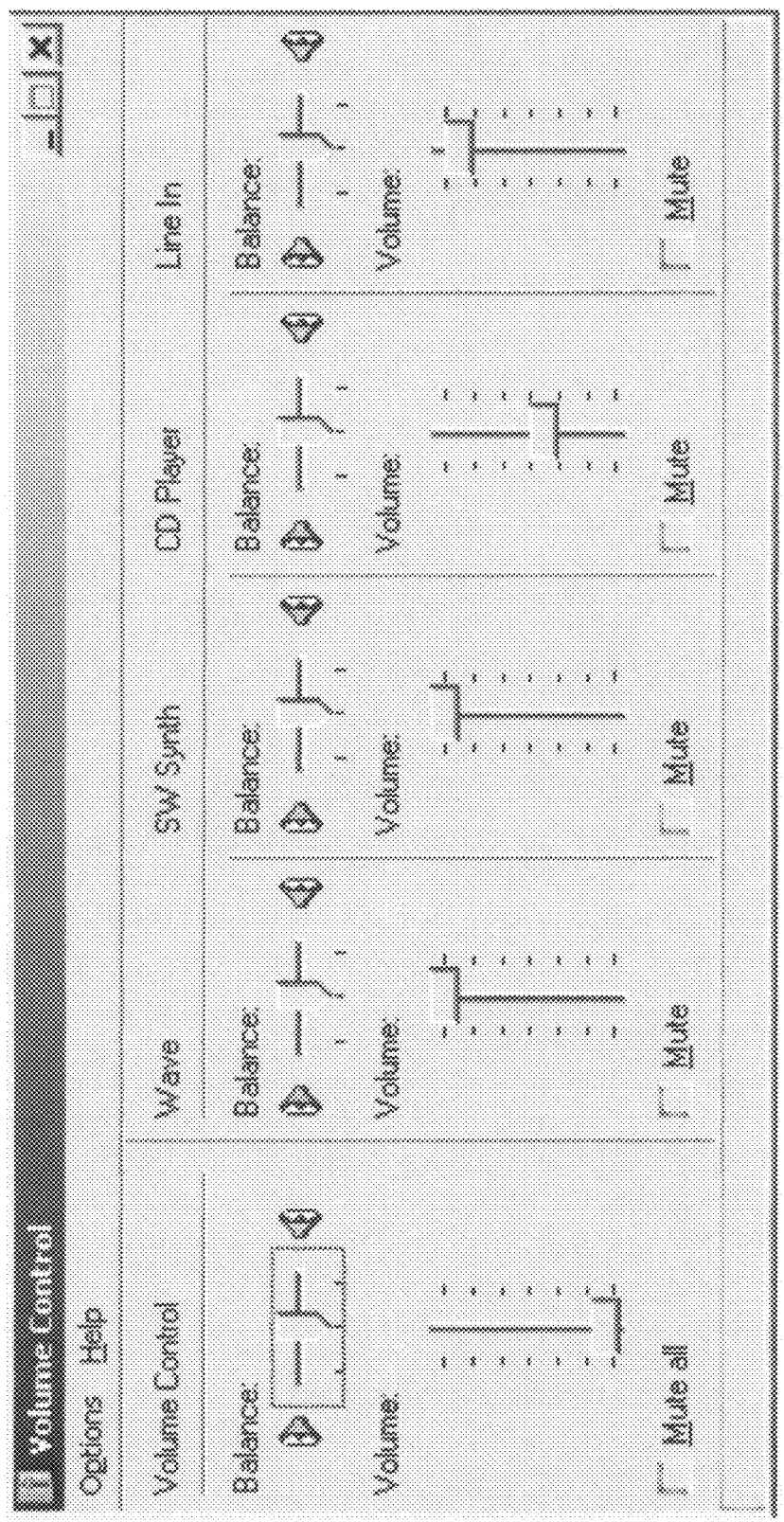
FIG. 8 shows a typical computer's volume control.

With respect to FIG. 8, what is shown is a typical computer's volume control. The master or main volume control of the computer system and its input volume levels are controlled via the computer's volume control applet (200). By adjusting the sliders and turning on or off the mute buttons the amplified audio levels are achieved. The master or main volume control has system audio output level control.

Figure 9:
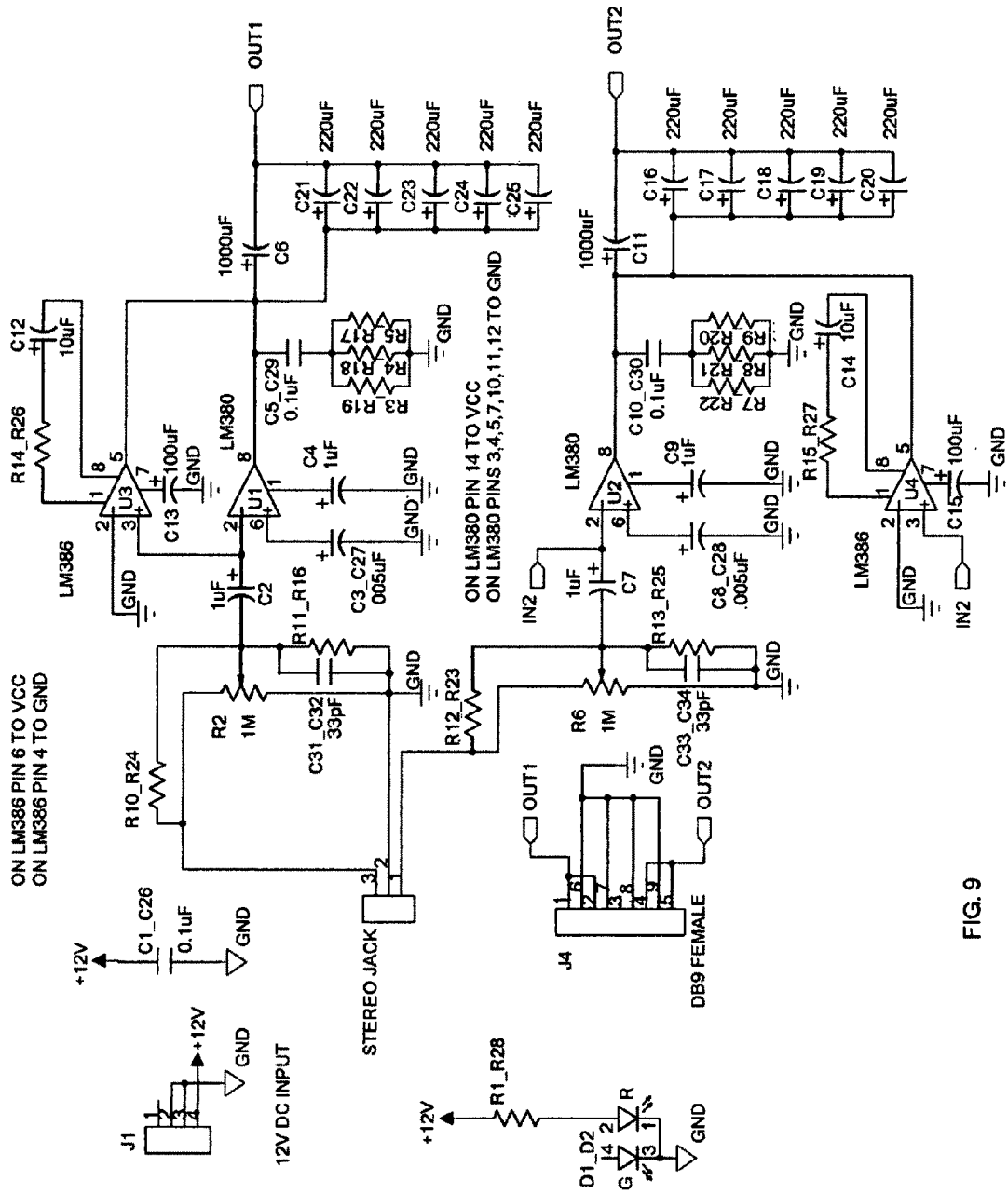
FIG. 9 shows the schematic of the present invention.

With Respect to FIG. 9, what is shown is one particular version of a circuit diagram descriptive of the present invention. The circuit diagram (220) shows the components, their values and electrical connections. It also shows the signal processing that occurs from the input to the output for left and right channels (stereo) and shows the power supply voltages used. Also shown are the three different sets of components for the two thru hole circuits and the one surface mount circuit. It should be appreciated by those of skill in the art that this particular circuit diagram is but one example of the circuitry that can be employed to implement the present invention. It is certainly possible to otherwise structure the circuit with variations in the components so as to produce the equivalent or substantially equivalent design. Such equivalent and substantially equivalent designs are intended to be and in fact are within the scope of this disclosure and with the scope of the present invention. With respect to making the present invention, the most preferable way is by assembling the parts on list (10) with a soldering iron and solder. The assembly is done by soldering or connecting the parts, IC chip (40), chip resistor (41), chip capacitor (42), electrolytic capacitor (43), chip LED (44), jack (50), header (165), screw terminal strip (80), DB9 connectors (184,185), and the ferrite bead (90) to the designated location on both the amplifier circuit board (100), and the speaker connector board (110). The Computer bracket (70) is then secured in place with standoff screws (75). The completed amplifier board (120) is then installed into the computer (140) and the speaker connector board (130) is attached at the computer bracket (70) via the DB9 connection (184,185) to the present invention (120). (see FIG. 4)

Alternatively the present invention could also be assembled by using a perforated board or prototyping board, wire, thru hole components and parts. By following a circuit diagram and soldering the wires in place, a working P.A. amplifier circuit would be constructed. Other methods for input, output and/or power, may be used such as, bare wire or different types of connectors. A board wired in this manner would eliminate the computer bracket (70) and the speaker connector board (130) and could be free standing and able to reside in any location where its connections did not short out.

Installation is accomplished by powering down the computer (140), unplugging the ac power cord (145) and removing the cover (150). Insert the device (120) into an open card slot and secure with a screw (155). Plug the computer's power supply cable (160) in to the device's 4 pin header (165) observing the polarity of the 12 volt supply. Replace the cover (150), plug in the ac power cord (145) and connect the stereo mini cable (170) from the computer's line out (173) to the audio input connector (174) of the device (120). Connect the speaker wires (175) to the 4 position screw terminal strip (80) of the speaker connector board (130) observing the polarity (+left, grd, grd, +right). Place the ferrite bead (90) around the two pairs of speaker wires (175) next to the speaker connector board (130) and plug the DB9 male (184) of the speaker connector board (130) into the DB9 female connector (185) of the device (120). Power up the computer and use the computers Volume Control (200) to adjust the volume level.

It is preferable for the present invention to be manufactured using the latest assembly technology in circuit board construction i.e. hole drilling, installation of surface mount parts, and physical assembly by a certified electronic assembly house to assure quality control.

To install the present invention, power down the computer, unplug the AC cord and remove the cover. Insert the device into an open card slot and secure the bracket in place with a screw. Plug the 12 volt power supply cable from the computer's power buss into the amp board's 4-pin header observing the polarity of the power supply. Replace the cover, plug in the AC cord and plug the stereo mini cable from the computer's audio line output to the audio input connector of the device. Connect the speaker wires to the 4 position screw terminal strip observing the polarity (+left, grd, grd, +right). Place the ferrite bead around the two pairs of speaker cables next to the speaker connector board and plug it into the DB9 connector of the device. Power up the computer and use the computer's volume controls (200) to adjust the volume level.

With the audio amplifier installed and the computer powered up the user is able to open a program for playing audio CDs, DVD's, and/or a various types of presentations while selecting the appropriate input is the computer is supporting which applies to the user's needs. With an audio source playing, the output level to the speakers is adjusted by opening the computer's volume control (200) and adjusting the main volume level as well as the input levels.

While the present invention has been described above in terms of specific embodiments, it is to be understood that the invention is not limited to these disclosed embodiments. Many modifications and other embodiments of the invention will come to mind of those skilled in the art to which this invention pertains, and which are intended to be and are covered by both this disclosure and the appended claims. It is indeed intended that the scope of the invention should be determined by proper interpretation and construction of the appended claims and their legal equivalents, as understood by those of skill in the art relying upon the disclosure in this specification and the attached drawings.

What is claimed is:

1. A stereo PA amplifier card comprising:
an amplifier board having an integrated circuit, a plurality of chip resistors, at least one chip LED, a plurality of chip capacitors, a plurality of electrolytic capacitors and a header,
a computer bracket having a stereo mini jack connect through an opening, and a female DB9 connector disposed through the computer bracket;
a speaker connector board having a four position screw terminal strip and male DB9 connector;
wherein the computer bracket is attached to the amplifier board and the male DB9 connector is inserted into the female DB9 connector.

2. The invention of claim 1 further comprising at least one stand off screws are disposed through the computer bracket in proximity to the female DB9 connector.

3. The invention of claim 2 further wherein the male DB9 connector has at least one screw which will connect with a corresponding at least one stand off screw of the computer bracket.

4. The invention of claim 3 wherein the four position screw terminal strip is configured with each of the four positions in a row, creating two end positions and two center positions.

5. The invention of claim 4 wherein one of the end positions of the four position screw terminal corresponds to positive and the other end corresponds with negative and each of the two center positions correspond to ground.

6. The invention of claim 5 wherein the integrated circuit, chip resistors, chip LED, chip capacitors, electrolytic capacitors and head are soldered onto the amplifier board.

7. The invention of claim 6 wherein the four position screw terminal strip and male DB9 connector are soldered onto the speaker connector board.

8. The invention of claim 7 wherein the amplifier board is inserted into an open card slot within a computer.

9. The invention of claim 8 where in the computer's power supply cable is connected to the four pin header.

10. The invention of claim 9 where in the stereo mini jack is connected to the computer's line out via a stereo mini cable.

* * * * *